US009021692B2

(12) United States Patent
Kawai et al.

(10) Patent No.: US 9,021,692 B2
(45) Date of Patent: May 5, 2015

(54) METHOD FOR MANUFACTURING A PRINTED WIRING BOARD

(75) Inventors: Satoru Kawai, Ogaki (JP); Kenji Sakai, Ibi-gun (JP); Liyi Chen, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 664 days.

(21) Appl. No.: 13/305,907

(22) Filed: Nov. 29, 2011

(65) Prior Publication Data

US 2012/0066901 A1 Mar. 22, 2012

Related U.S. Application Data

(62) Division of application No. 12/606,546, filed on Oct. 27, 2009, now Pat. No. 8,686,300.

(60) Provisional application No. 61/140,746, filed on Dec. 24, 2008.

(51) Int. Cl.
*H05K 3/10* (2006.01)
*H05K 3/40* (2006.01)
*H05K 1/11* (2006.01)
(Continued)

(52) U.S. Cl.
CPC .............. *H05K 3/4007* (2013.01); *H05K 1/113* (2013.01); *H05K 3/205* (2013.01); *H05K 3/4644* (2013.01); *H05K 3/4682* (2013.01);
(Continued)

(58) Field of Classification Search
CPC .............. H05K 3/0094; H05K 3/385; H05K 201/0209; H05K 201/0215; H05K 201/0347; H05K 201/09563; H05K 1/113; H05K 3/4007; H05K 3/205; H05K 3/4644; H05K 3/4682; H05K 2201/0367

USPC .................. 29/825, 830, 832, 840, 846, 852; 428/209
See application file for complete search history.

(56) References Cited

U.S. PATENT DOCUMENTS 5,965,944 A 10/1999 Frankoski et al.
6,376,049 B1 * 4/2002 Asai et al. ..................... 428/209
(Continued)

FOREIGN PATENT DOCUMENTS

JP 2000-323613 11/2000
JP 2003-218286 7/2003
(Continued)

OTHER PUBLICATIONS

U.S. Appl. No. 13/240,626, filed Sep. 22, 2011, Nakai, et al.
(Continued)

*Primary Examiner* — Carl Arbes
(74) *Attorney, Agent, or Firm* — Oblon, McClelland, Maier & Neustadt, L.L.P.

(57) ABSTRACT

A printed wiring board includes a resin insulation layer having a first surface and a second surface on an opposite side of the first surface, the resin insulation layer having an opening for a first via conductor, a pad formed on the first surface of the resin insulation layer and provided to mount an electronic component, a first conductive circuit formed on the second surface of the resin insulation layer, and a first via conductor formed in the opening and connecting the pad and the first conductive circuit. The pad has an embedded portion embedded in the resin insulation layer and a protruding portion protruding from the resin insulation layer, and the embedded portion has an external shape which is greater than an external shape the protruding portion.

20 Claims, 14 Drawing Sheets

(51) Int. Cl.
*H05K 3/20* (2006.01)
*H05K 3/46* (2006.01)

(52) U.S. Cl.
CPC ............... *H05K 2201/0367* (2013.01); *H05K 2201/09472* (2013.01); *H05K 2201/096* (2013.01); *H05K 2203/0361* (2013.01)

(56) References Cited

U.S. PATENT DOCUMENTS

| | | | |
|---|---|---|---|
| 6,376,052 B1 * | 4/2002 | Asai et al. | ............ 428/209 |
| RE40,947 E * | 10/2009 | Asai et al. | ............ 428/209 |
| 8,238,114 B2 | 8/2012 | Niki et al. | |
| 2001/0011777 A1 | 8/2001 | Kano | |
| 2002/0135058 A1 | 9/2002 | Asahi et al. | |
| 2005/0252682 A1 | 11/2005 | Shimoto et al. | |
| 2007/0034401 A1 | 2/2007 | Shim | |
| 2008/0149383 A1 | 6/2008 | Kaneko et al. | |
| 2008/0245549 A1 | 10/2008 | Kodani et al. | |
| 2010/0018763 A1 | 1/2010 | Barry | |
| 2011/0056838 A1 | 3/2011 | Kawai | |

FOREIGN PATENT DOCUMENTS

| | | |
|---|---|---|
| JP | 2004-79891 A | 3/2004 |
| JP | 2005-57223 A | 3/2005 |

OTHER PUBLICATIONS

U.S. Appl. No. 13/273,335, filed Oct. 14, 2011, Kawai, et al.

* cited by examiner (A)

(B)

(C)

(A)

(B)

(C)

(A)

space formed by second plating resist
space formed by coating layer (B)

METHOD FOR MANUFACTURING A PRINTED WIRING BOARD

CROSS-REFERENCE TO RELATED APPLICATIONS

The present application is a divisional of and claims the benefit of priority to U.S. application Ser. No. 12/606,546, filed Oct. 27, 2009, which is based on and claims the benefit of priority to U.S. Application No. 61/140,746, filed Dec. 24, 2008. The contents of these applications are incorporated herein by reference in their entirety.

BACKGROUND OF THE INVENTION

1. Field of the Invention

The present invention is related to a printed wiring board having a pad formed on the upper-surface side of a resin insulation layer to mount an electronic component such as a semiconductor element, a conductive circuit (including an external connection terminal) formed on the lower-surface side of the resin insulation layer to be connected to an external substrate, and a via conductor formed in the resin insulation layer to connect the pad and the external connection terminal. The present invention is also related to a method for manufacturing such a printed wiring board.

2. Discussion of the Background

Japanese Laid-Open Patent Publication 2000-323613 describes a printed wiring board (multilayer substrate) formed by alternately laminating a resin insulation layer and a conductive layer without using a core substrate. In the multilayer substrate of Japanese Laid-Open Patent Publication 2000-323613, pads for a semiconductor element are formed on the upper-surface side, and pads for external connection terminals are formed on the lower-surface side. The pads for a semiconductor element are embedded in the outermost insulation layer on the upper-surface side. The surfaces of the pads for a semiconductor element are set at the same level as the outermost-layer surface, or are recessed from the outermost-layer surface. On the other hand, the pads for external connection terminals on the lower-surface side are formed on the outermost insulation layer at the lower-surface side. The contents of this publication are incorporated herein by reference in their entirety.

SUMMARY OF THE INVENTION

According to one aspect of the present invention, a printed wiring board includes a resin insulation layer having a first surface and a second surface on an opposite side of the first surface, the resin insulation layer having an opening for a first via conductor, a pad formed on the first surface of the resin insulation layer and provided to mount an electronic component, a first conductive circuit formed on the second surface of the resin insulation layer, and a first via conductor formed in the opening and connecting the pad and the first conductive circuit. The pad has an embedded portion embedded in the resin insulation layer and a protruding portion protruding from the resin insulation layer, and the embedded portion has an external shape which is greater than an external shape the protruding portion.

According to another aspect of the present invention, a method for manufacturing a printed wiring board includes forming a pad having a protruding portion and an embedded portion on a metal film and a plated film formed on the metal film, the pad having a coating layer on the protruding portion, the protruding portion being formed in an opening portion formed in the plated film, the embedded portion being exposed over the plated film, forming on the plated film and the pad a resin insulation layer having a first surface and a second surface on an opposite side of the first surface, the first surface of the resin insulation layer facing the plated film and the pad, removing the metal film and the plated film from the first surface of the resin insulation layer such that the protruding portion of the pad protrudes from the first surface of the resin insulation layer, forming in the resin insulation layer an opening for a first via conductor reaching the pad from the second surface of the resin insulation layer, forming a first conductive circuit on the second surface of the resin insulation layer, and forming the via conductor in the opening of the resin insulation layer such that the first conductive circuit and the pad are connected.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
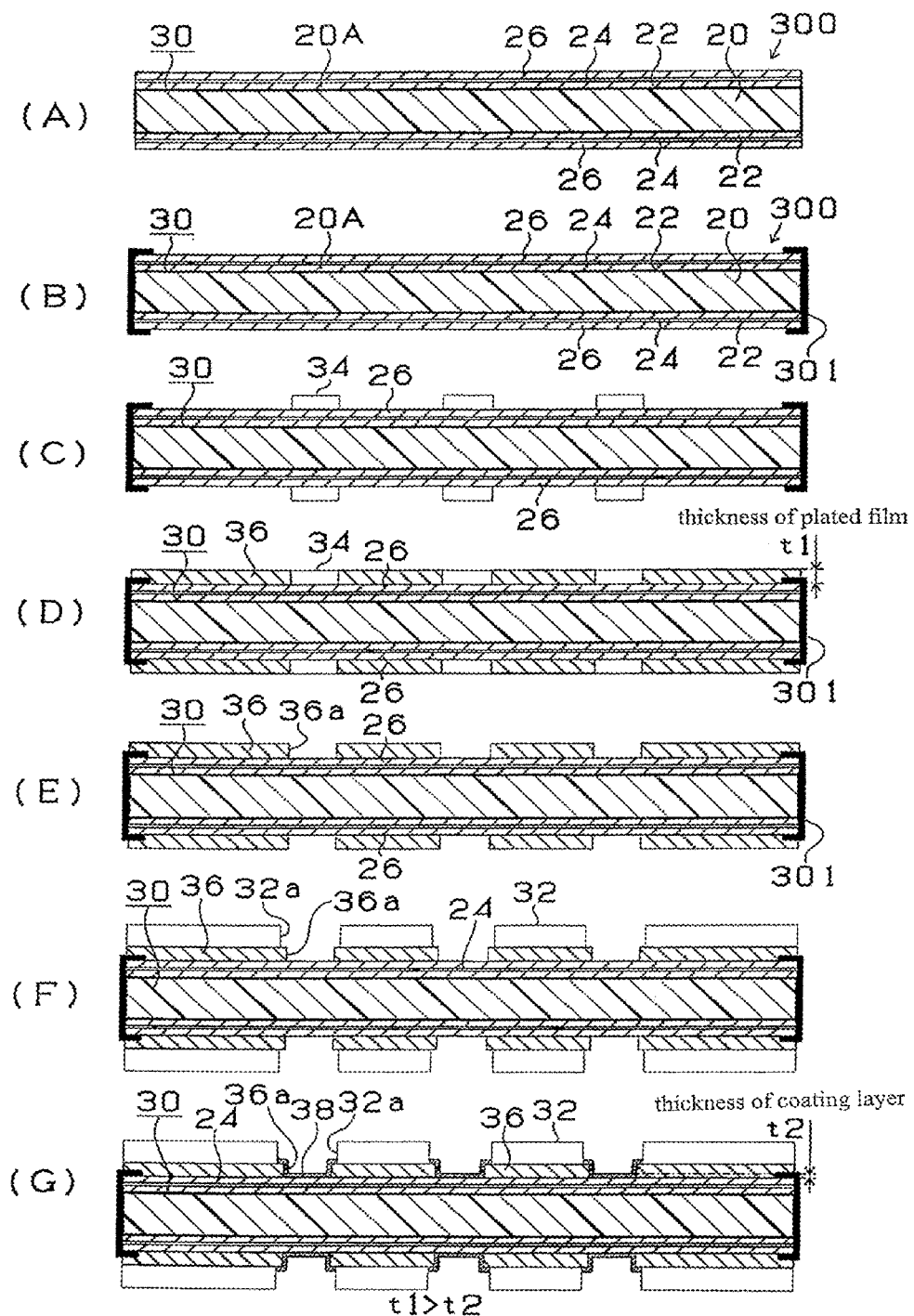
FIG. 1 includes views showing the steps of a method for manufacturing a multilayer printed wiring board according to the first embodiment of the present invention.
Figure 2:
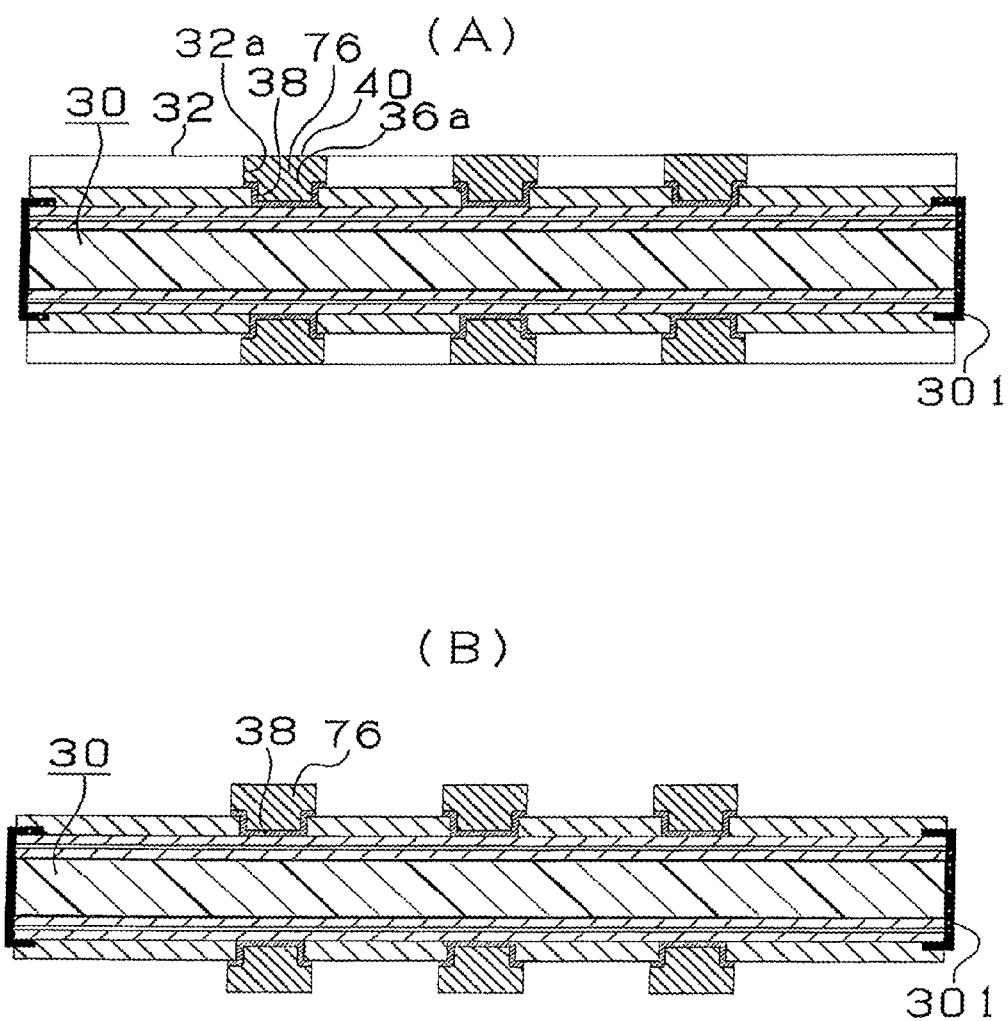
FIG. 2 includes views showing the steps of a method for manufacturing a multilayer printed wiring board according to the first embodiment.
Figure 3:
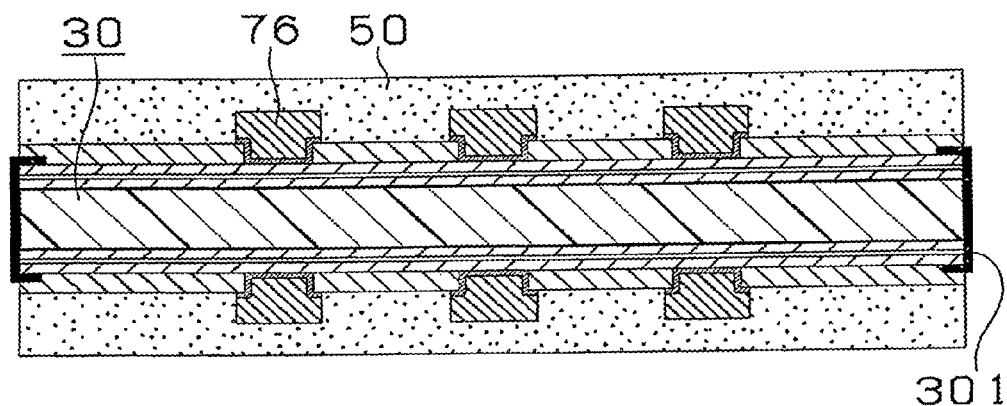
FIG. 3 includes views showing the steps of a method for manufacturing a multilayer printed wiring board according to the first embodiment.
Figure 3:
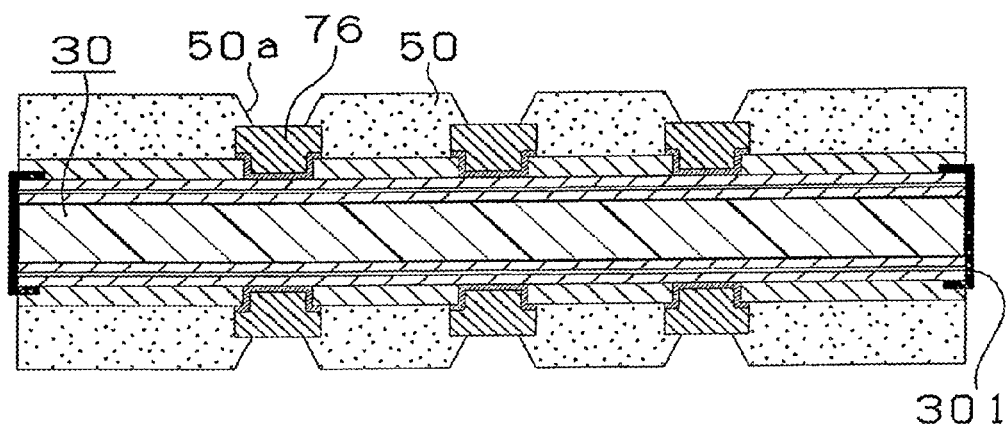
Figure 3:
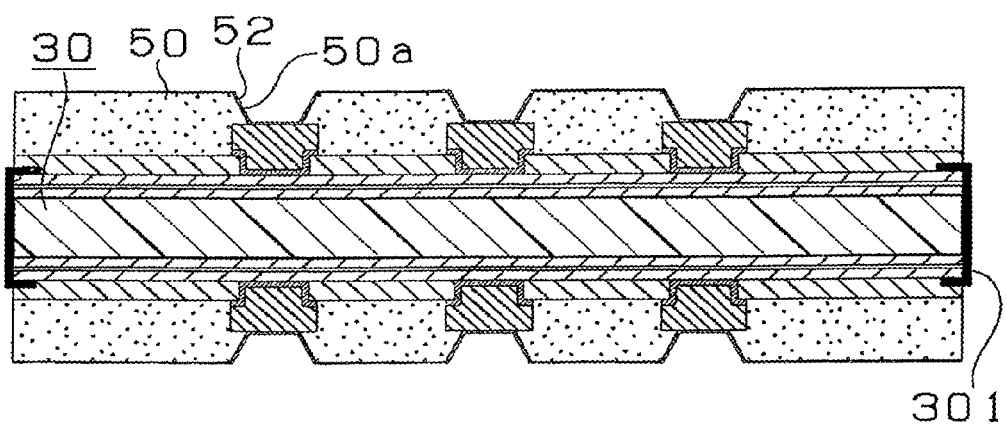
Figure 4:
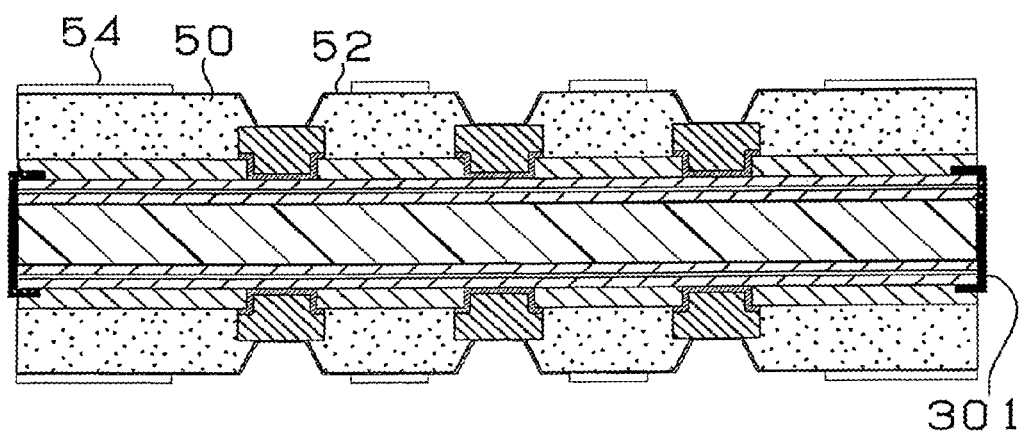
FIG. 4 includes views showing the steps of a method for manufacturing a multilayer printed wiring board according to the first embodiment.
Figure 4:
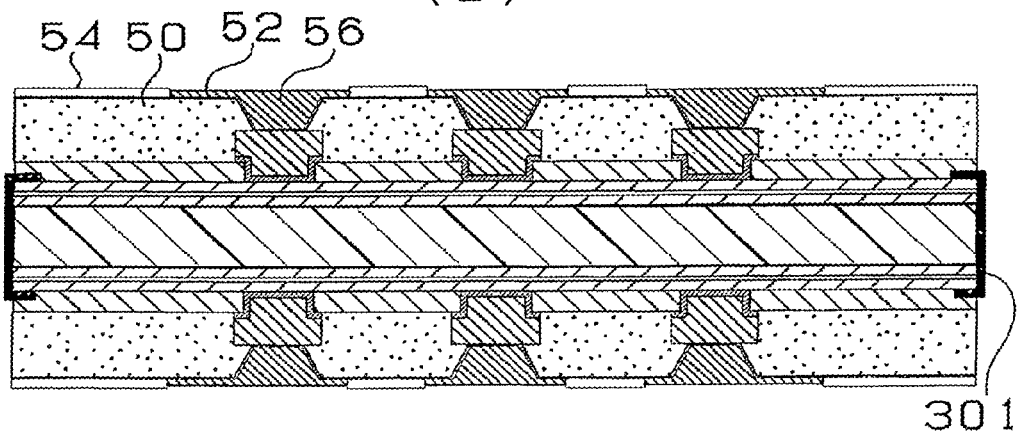
Figure 4:
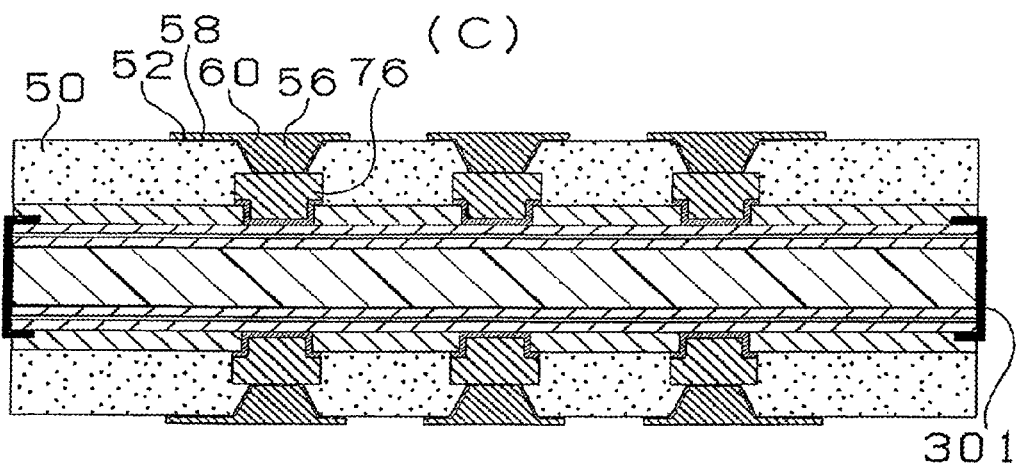
Figure 5:
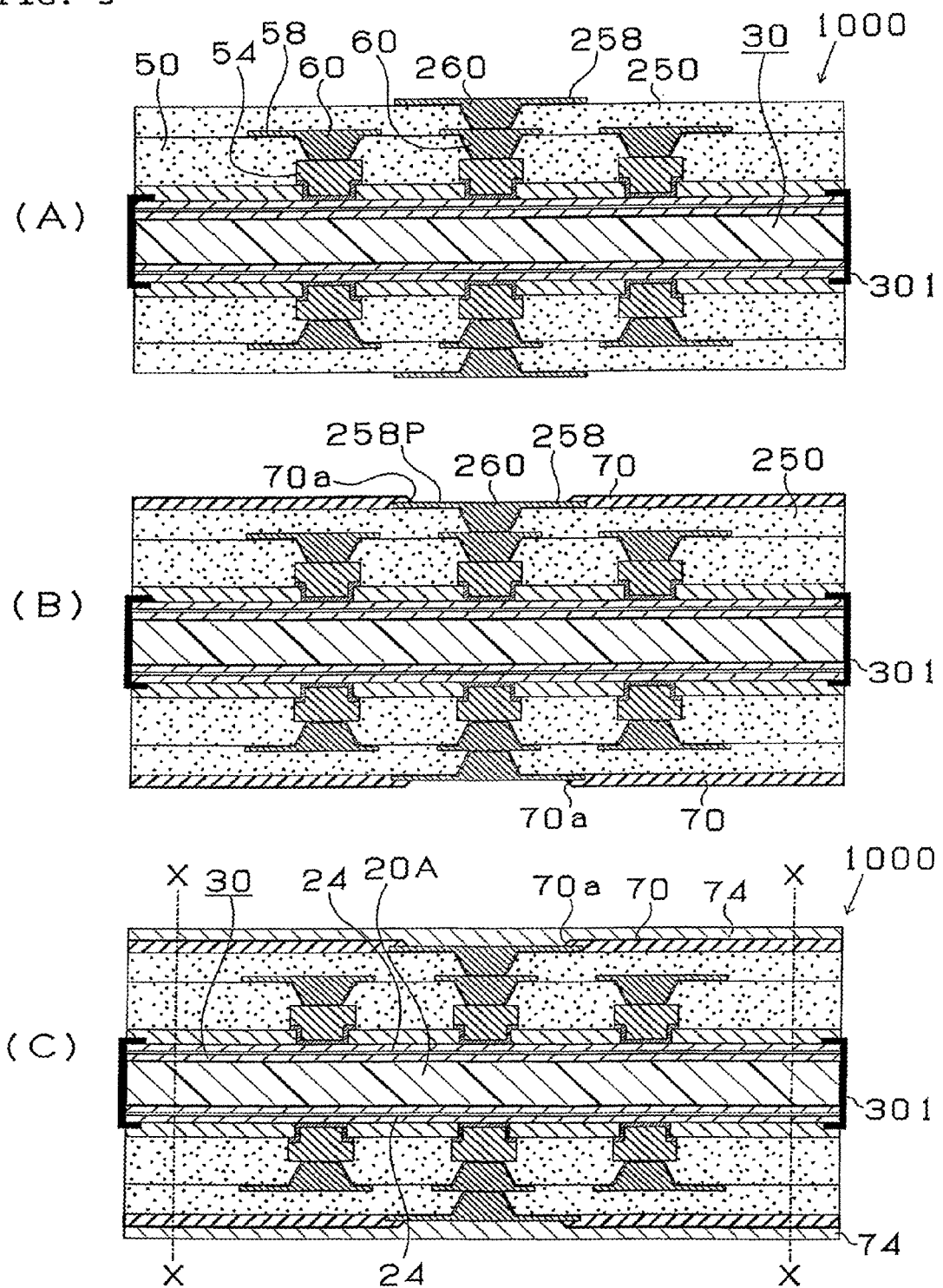
FIG. 5 includes views showing the steps of a method for manufacturing a multilayer printed wiring board according to the first embodiment.
Figure 6:
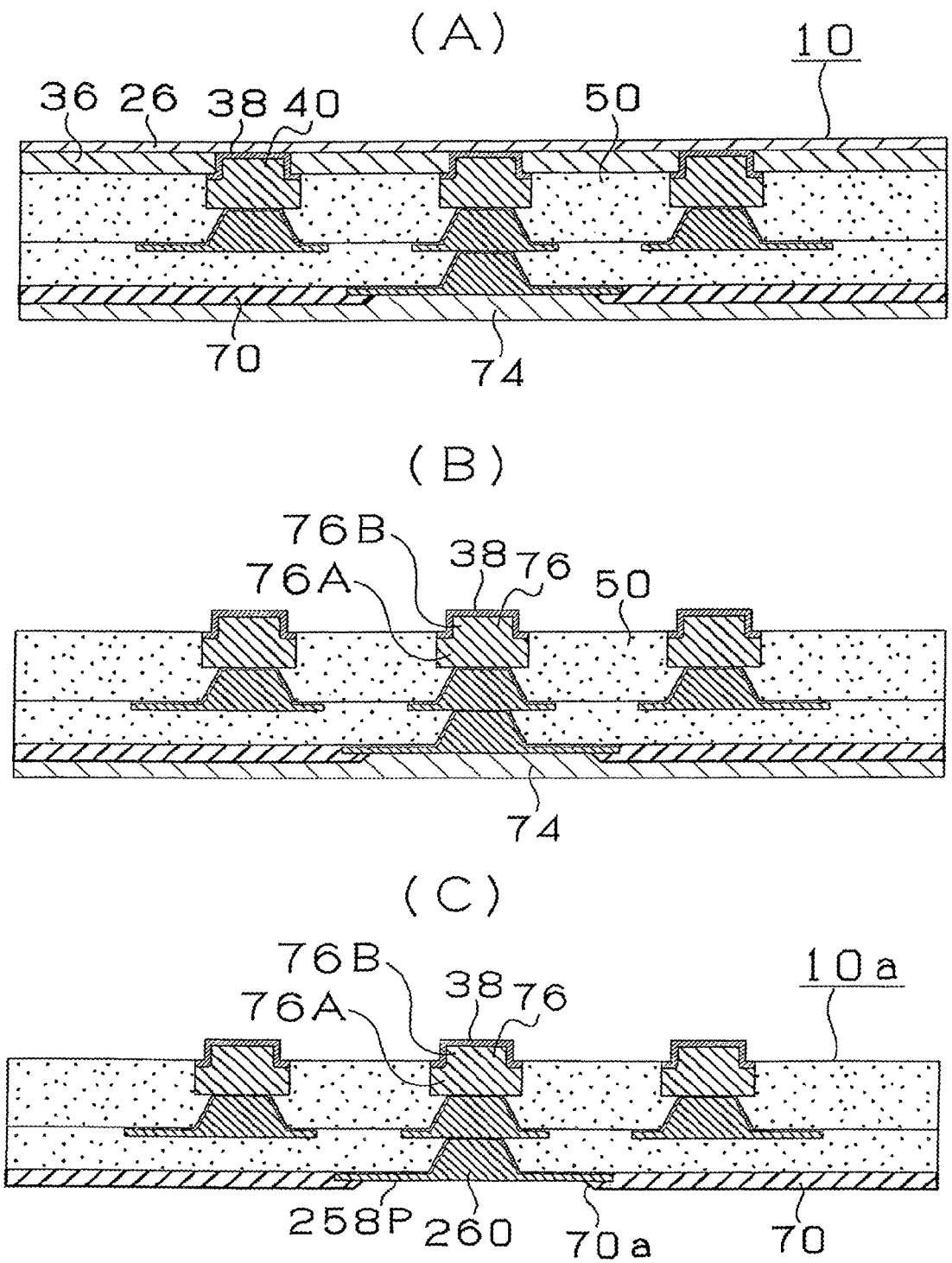
FIG. 6 includes views showing the steps of a method for manufacturing a multilayer printed wiring board according to the first embodiment.

The embodiments will now be described with reference to the accompanying drawings, wherein like reference numerals designate corresponding or identical elements throughout the various drawings.

First Embodiment

Figure 7:
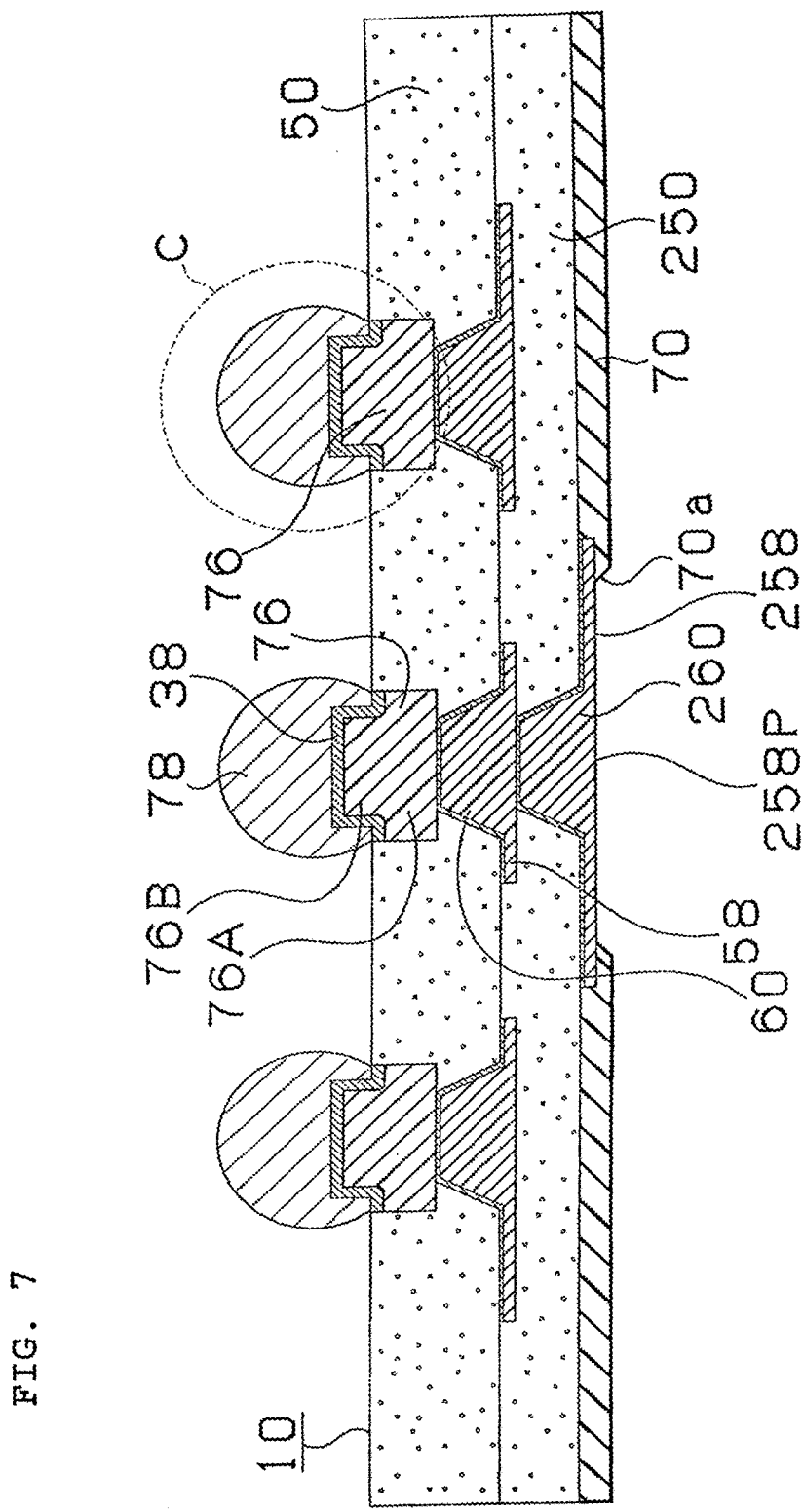
FIG. 7 is a cross-sectional view showing a multilayer printed wiring board of the first embodiment.
Figure 8:
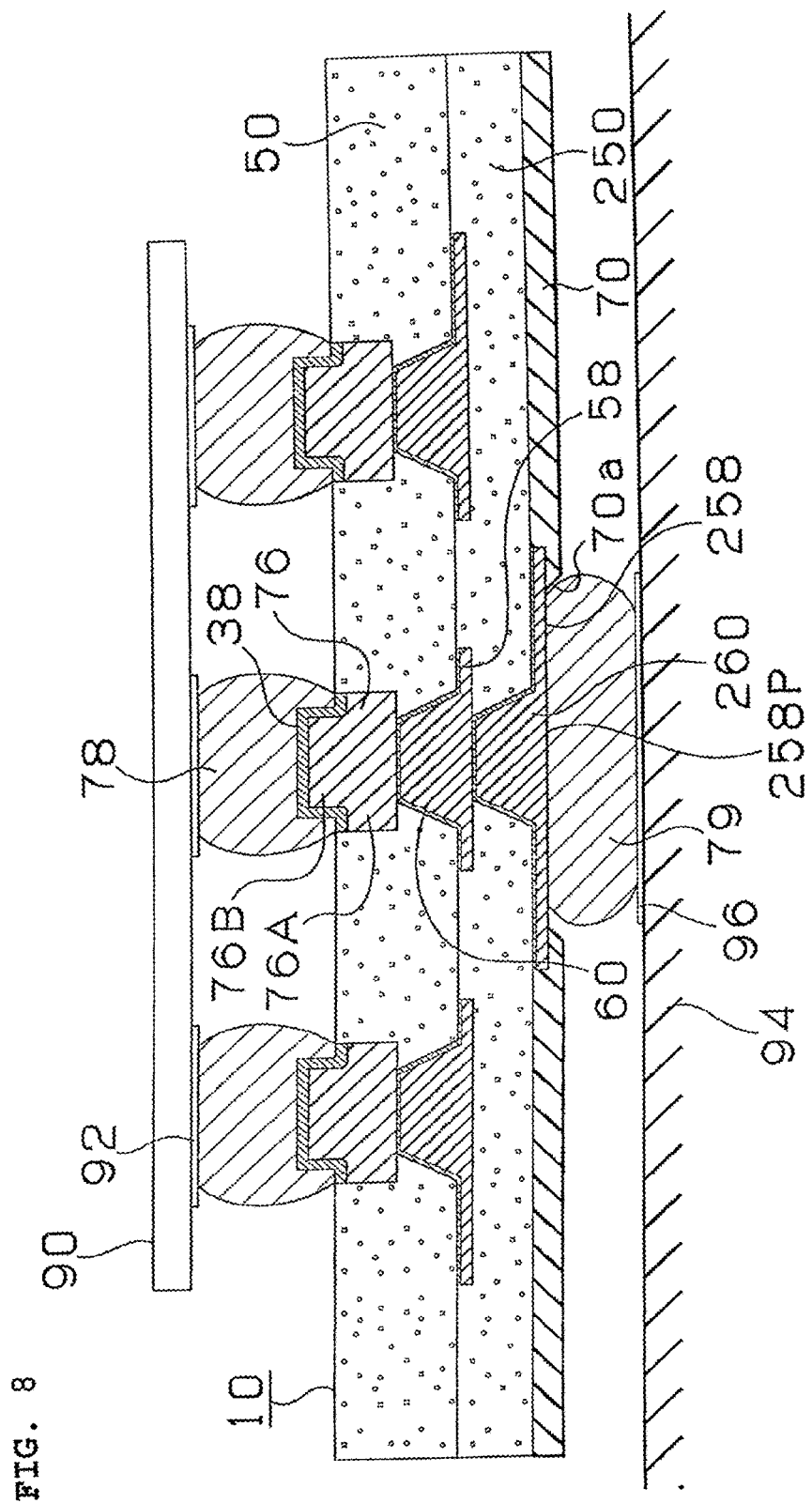
FIG. 8 is a cross-sectional view showing a state in which an IC chip is mounted on a multilayer printed wiring board of the first embodiment.

First, the structure of multilayer printed wiring board 10 according to the first embodiment of the present invention is described with reference to FIGS. 1-8. FIG. 7 is a cross-sectional view of multilayer printed wiring board 10. FIG. 8 is a view showing a state in which IC chip 90 is mounted on multilayer printed wiring board 10 shown in FIG. 7, and multilayer printed wiring board 10 is loaded on motherboard 94. Multilayer printed wiring board 10 has pads 76 for connection with electronic component 90 such as an IC chip on the upper-surface side, and pads (external connection terminals) (258P) for connection with motherboard 94 on the lower-surface side. Pad 76 on the upper-surface side is made up of a portion (embedded portion) (76A) embedded in resin insulation layer (outermost resin insulation layer) 50 and of a portion (protruding portion) (76B) protruding from resin insulation layer 50. The side wall of the embedded portion makes contact with the resin insulation layer. On the surfaces (top and side surfaces) of protruding portion (76B), coating layer 38 is formed. The coating layer is preferred to be made of plated film. In the first embodiment, the coating layer is made of tin-plated film. Solder bump 78 is formed on the coating layer, and the pad is connected to electrode 92 of IC chip 90 by means of solder bump 78. If tin-plated film is formed on the pad as a coating layer, wettability will be enhanced between the pad and the solder bump. Meanwhile, on the lower-surface side of the multilayer printed wiring board, lowermost resin insulation layer 250 is formed. On the second surface (the surface where external connection terminals are formed) of the lowermost resin insulation layer, conductive circuits 258 including pads (external connection terminals) (258P) are formed. In lowermost resin insulation layer 250, via conductors 260 are formed. On the second surface of lowermost resin insulation layer 250, solder resist layer 70 with openings (70a) is formed. Portions of conductive circuits 258 or via conductors 260 exposed through openings (70a) of solder resist layer 70 work as external connection terminals (258P). The multilayer wiring board is connected to motherboard 94 or pins by means of solder bumps 79 formed on external connection terminals (258P).

Pads 76 for connection with an IC chip on the upper-surface side and pads (258P) for connection with a motherboard on the lower-surface side are connected by means of via conductors 60 formed in resin insulation layer 50 and via conductors 260 formed in resin insulation layer 250.

Figure 9:
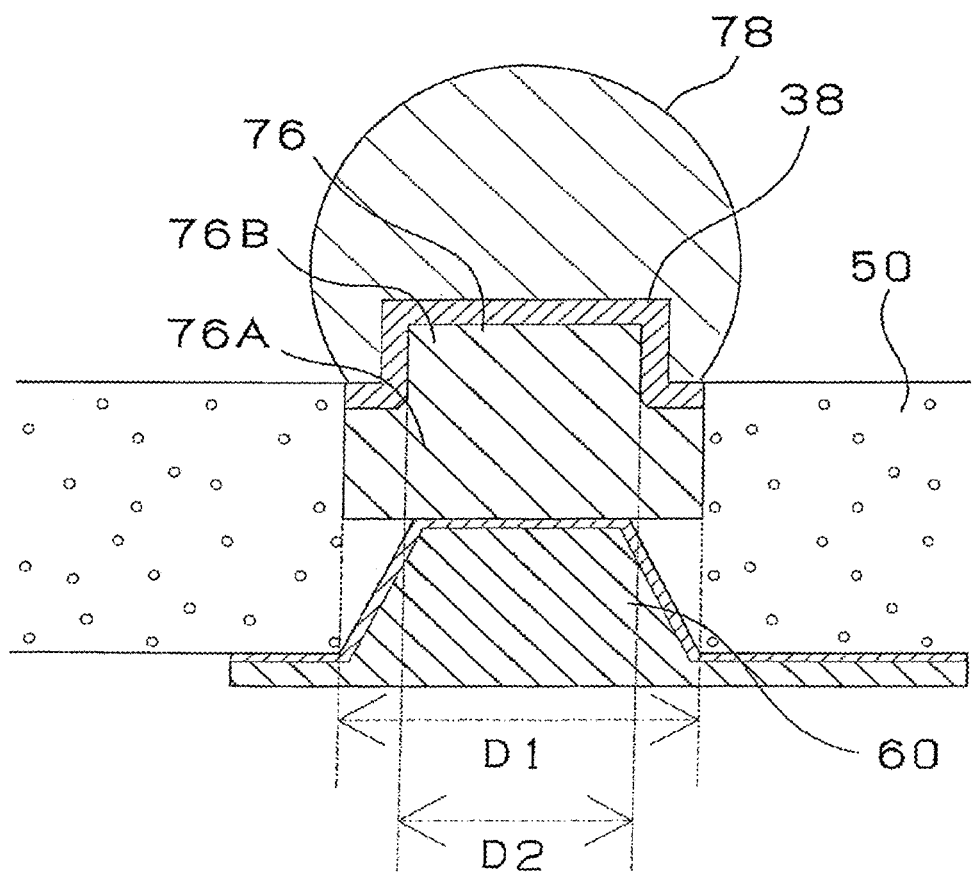
FIG. 9 is a cross-sectional view showing a magnified view of a pad in the multilayer printed wiring board shown in FIG. 7.

A magnified view of pad 76 in circle "C" of FIG. 7 is shown in FIG. 9. In multilayer printed wiring board 10 of the first embodiment, pad 76 on the upper-surface side is made up of a portion (embedded portion) (76A) embedded in resin insulation layer 50 and of a portion (protruding portion) (76B) protruding from resin insulation layer 50. Pads 76 on the upper-surface side are pads for mounting electronic components such as an IC. In a multilayer printed wiring board according to the first embodiment, outer diameter (D2) of protruding portion (76B) is smaller than outer diameter (D1) of embedded portion (76A). A solder bump is formed on the surfaces of the protruding portion and on the top surface of the embedded portion. Thus, the surface area of a pad of the first embodiment is made greater than that of a pad whose surface in contact with a solder bump is flat. Thus, the connection area will increase between pad 76 and solder bump 78. Accordingly, in multilayer printed wiring board 10 of the first embodiment, the bonding strength between pad 76 and solder bump 78 increases. As a result, connection reliability is enhanced between pad 76 and solder bump 78.

Resin insulation layers 50, 250 forming multilayer printed wiring board 10 of the first embodiment are made of resin and inorganic particles such as silica. As for inorganic particles other than silica, these may be listed: alumina, barium sulfate, magnesium oxide or the like. Accordingly, in a printed wiring board of the first embodiment, warping or undulation may tend to occur. When mounting an electronic component in such a printed wiring board, the space between an electrode of the electronic component and a pad may differ in each pad. Thus, the mounting productivity of an electronic component or the connection reliability between the electronic component and the printed wiring board may tend to decrease. However, in a printed wiring board according to the first embodiment, since pad 76 has protruding portion (76B), the height of solder bump 78 may be raised. As a result, the mounting productivity or the mounting reliability of an electronic component may be enhanced in a printed wiring board of the first embodiment. Resin insulation layers in the multilayer printed wiring board of the first embodiment do not contain core material such as glass fiber or the like, but a resin insulation layer with core material may be used to suppress warping. Especially, when the number of resin insulation layers is four or less, it is preferred that a layer be such a resin insulation layer made of inorganic particles, core material and resin. When the number of resin insulation layers is four or more, it is preferred that all the layers be such resin insulation layers made of inorganic particles and resin. As for core material, glass cloth, glass non-woven fabric, aramid non-woven fabric or the like may be used.

Figure 14:
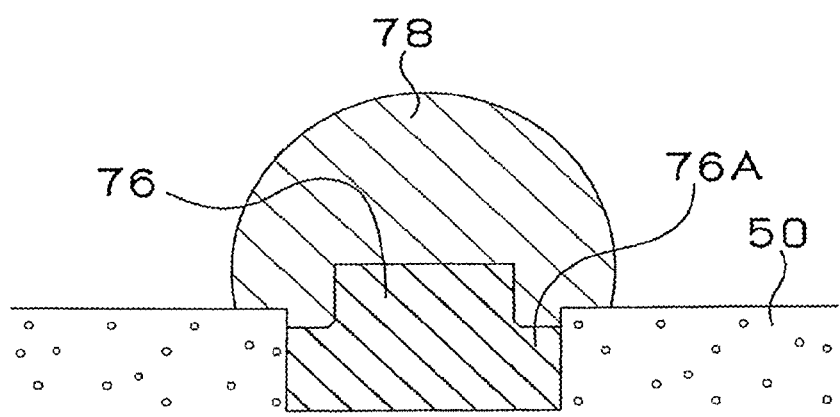
FIG. 14 is a cross-sectional view showing a magnified view of a pad in multilayer printed wiring boards of the embodiments of the present invention.

In a printed wiring board of the first embodiment, since tin-plated film 38 is formed on the surfaces of protruding portion (76B), wettability between a solder bump and a pad may be improved. It is preferred that the coating film be also formed on the embedded portion (on the upper surface of the embedded portion) left exposed by the protruding portion. In addition, when reflowing a solder bump, tin-plated film 38 fuses into the solder bump. Accordingly, the connection reliability between a pad and solder bump is enhanced. The upper surface of the embedded portion (the part of the embedded portion left exposed by the protruding portion) which is not covered by the protruding portion is preferred to be recessed from the first surface of the resin insulation layer (see FIG. 14). FIG. 14 is a view showing a state in which the coating layer is fused into the solder bump. The bump is formed directly on the pad. Also, such a coating layer may be formed more inexpensively and easily than forming a coating layer of nickel and gold.

In the following, a method for manufacturing multilayer printed wiring board 10 described above with reference to FIG. 7 will be described by referring to FIGS. 1-6.

(1) Metal film 300 with a carrier is prepared (FIG. 1A). The metal film with a carrier is formed with carrier (support plate) 30 and metal film 26 on the carrier. The metal film is laminated on both surfaces of the carrier by means of removable layer 24. As for a carrier, glass-fiber reinforced substrates or double-sided copper-clad laminates with a thickness in the range of 40 μm to 800 μm may be used. As for a metal film, copper foils, nickel foils, aluminum foils or the like with a thickness in the range of 3 μm to 50 μm may be used. As for removable layer 24, the following may be used: metallic removable layers made of nickel or chrome or the like; organic removable layers made of carboxybenzotriazole (CBTA), N', N'-bis(benzotriazolyl methyl) urea (BTD-U), or 3-amino-1H-1,2,4-triazole (ATA) or the like. The carrier and the metal film are secured with adhesive (301) (FIG. 1B). On metal film 26 of metal film 300 with a carrier, plating resist (first plating resist) 34 is formed (FIG. 1C). Then, on areas of the metal film where plating resist 34 is not formed (the metal film left exposed by the first plating resist), plating resist 36 is formed (thickness: (t1) μm) (FIG. 1D). Specifically, using metal film 26 as the seed, electrolytic plating is performed to form electrolytic copper, nickel, gold or silver plated film. Plated film 36 is preferred to be made from the same metal as that of metal film 22. It is preferred that the metal film be made of copper foil, and that the plated film be electrolytic copper-plated film. Then, plating resist 34 is removed (FIG. 1E).

Figure 12:
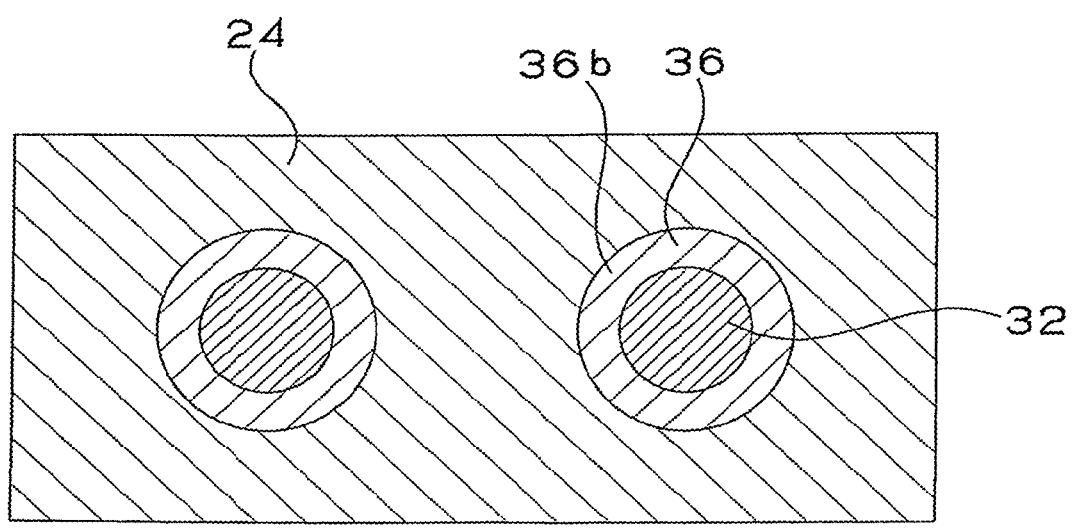
FIG. 12 is a view to illustrate the second plating resist formed on plated film.

(2) Second plating resist 32 is formed on plated film 36 (FIG. 1F). During that time, the periphery of plated film 36 is preferred to be left exposed by the second plating resist (see FIG. 12). FIG. 12 is a plan view of the substrate in FIG. 1E seen from above. Peripheral portions (36b) of the plated film are exposed.

(3) On metal film 26 left exposed by the second plating resist, coating layer 38 (thickness: (t2) μm) is formed (FIG. 1G). The relationship of (t2) and (t1) is (t2)≤(t1). Coating layer 38 is preferred to be made of a metal other than that of plated film 36. Furthermore, coating layer 38 is preferred to be made of a metal other than that of metal film 26. As for such a coating layer, a metal layer made of electroless plated films, electrolytic plated films or sputtered films may be listed. As for the metal to form such a coating layer, tin, nickel, gold, silver, palladium, platinum, solder or the like may be listed. Such a coating layer may contain two or more metal layers. If a coating layer is formed with two metal layers, the first metal layer formed on the metal film may be tin, solder or gold; and the second metal layer formed on the first metal layer may be nickel or palladium. When a coating layer is formed with two metal layers, a combination of tin and nickel, a combination of solder and nickel, or a combination of gold and nickel is preferred to make first and second metal layers in that order. If a coating layer is formed with three metal layers, the first metal layer formed on the metal film may be tin, solder or gold; the second metal layer formed on the first metal layer may be palladium; and the third metal layer formed on the second metal layer may be nickel. When peripheral portions (36b) of plated film 36 are left exposed by the second plating resist, the coating layer is preferred to be formed on the metal film, the side walls of the plated film and peripheral portions (36b) of the plated film, which are left exposed by the second plating resist.

Figure 13:
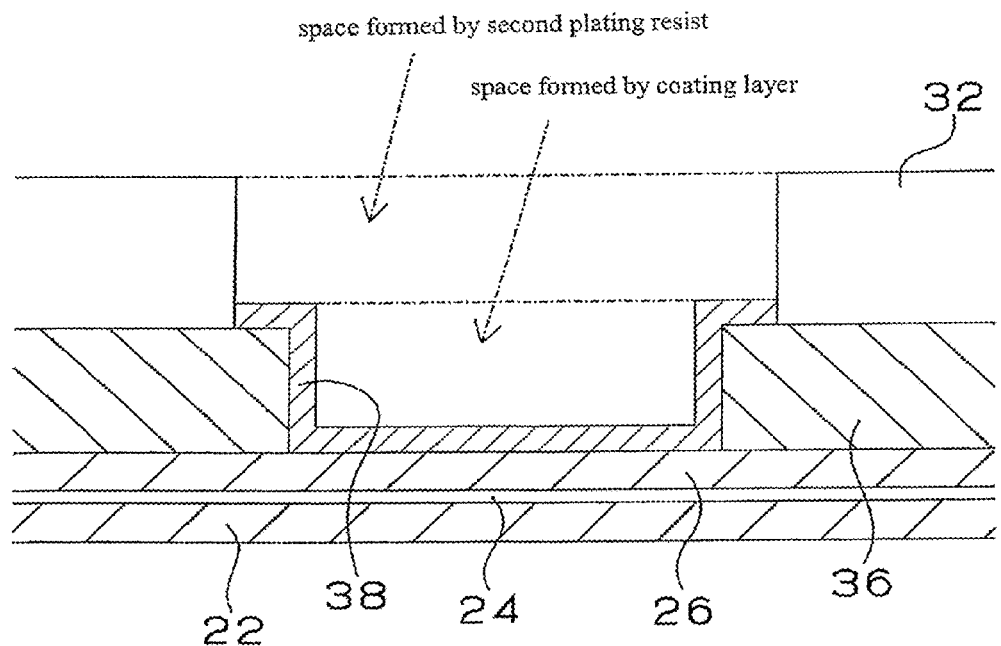
FIG. 13A is a view to illustrate a space formed by the coating layer and a space formed by the second plating resist.
FIG. 13B is a view to illustrate an example in which part of the space formed by the second plating resist is filled with plating.
Figure 13:
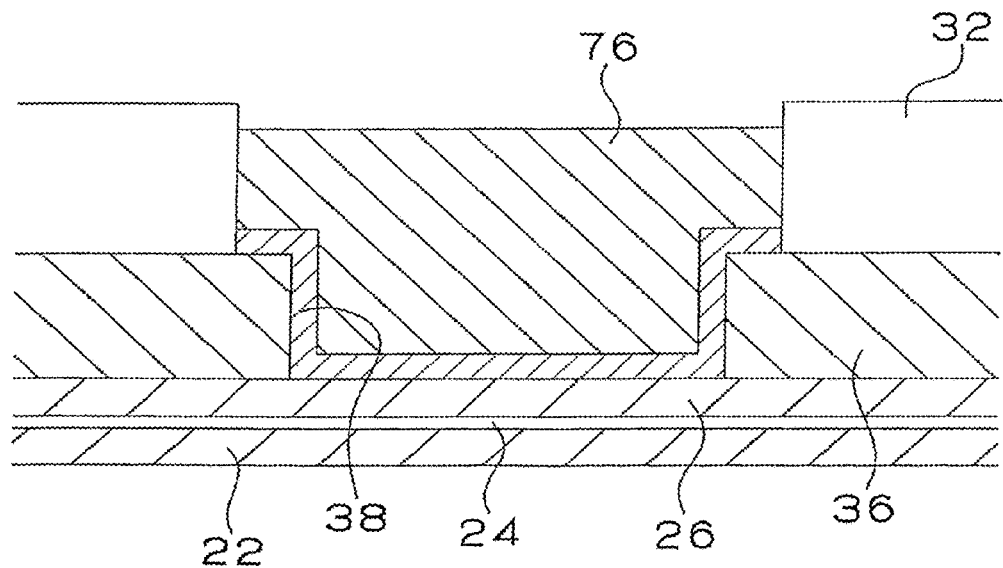

(4) By plating, pads 76 made of plating conductor are formed on the coating layer (FIG. 2A). As for plating, electrolytic plating and electroless plating may be used. The plating in the first embodiment is electrolytic copper plating. Pads are preferred to be made of electrolytic copper-plated film. As shown in FIGS. 2A and 13A, a space formed by the coating layer is filled using the plating of a pad. Furthermore, part of or the entire space formed by the second plating resist is filled using the plating of a pad. FIG. 2A shows an example in which the space formed by the second plating resist is filled with plating; and FIG. 13B shows an example in which part of the space formed by the second plating resist is filled with plating. The bottom surface of a pad is preferred to be flat.

(5) Plating resist 32 is removed and pads 76 are exposed (FIG. 2B). The pad surfaces may be roughened.

(6) Resin film having a first surface and a second surface opposite the first surface is prepared.

(7) A resin film is laminated in such a way that the first surface of the resin film faces pads 76 and plated film 36. After that, by curing the resin film, resin insulation layer 50 is formed on pads 76 and plated film 36 (FIG. 3A). The resin insulation layer has a first surface and a second surface opposite the first surface. The first surface of the resin insulation layer is the surface where pads 76 are formed. Portions of the side walls of pads 76 contact resin insulation layer 50.

(8) Next, using a CO2 laser, openings (50a) for first via conductors reaching pads 76 are formed in resin insulation layer 50 (FIG. 3B). Openings (50a) for first via conductors reaching pads 76 expose the bottom surfaces of the pads.

(9) The surface of resin insulation layer 50, including the inner walls of openings (50a), is roughened (not shown in the drawings). After that, a catalyst is applied to the surface of resin insulation layer 50 including the inner walls of openings (50a).

(10) Next, the substrate with the applied catalyst is immersed in an electroless plating solution, and electroless plated film 52 is formed on the surface of resin insulation layer 50, including the inner walls of openings (50a) (FIG. 3C). Electroless copper-plated film or electroless nickel-plated film may be used as such electroless plated film. Electroless copper-plated film is preferred.

(11) Plating resist 54 is formed on the substrate where electroless plated film 52 is formed (FIG. 4A).

(12) Next, in areas where plating resist 54 is not formed, electrolytic plated film 56 is formed (FIG. 4B). As for such electrolytic plated film, electrolytic copper-plated film is preferred.

(13) Furthermore, after plating resist 54 is removed, the electroless plated film residing between portions of electrolytic plated film is removed by etching. Accordingly, independent conductive circuits 58 and first via conductors 60 are formed (FIG. 4C). Then, surfaces of conductive circuits 58 and first via conductors 60 are roughened (not shown in the drawings).

(14) By repeating above steps (7)-(13), resin insulation layer (lower resin insulation layer) 250 having outermost via conductors (second via conductors) 260 and outermost conductive circuits (second conductive circuits) 258 are formed (FIG. 5A). Accordingly, intermediate substrate 1000 is completed. The first embodiment is a case with two resin insulation layers. Since the number of resin insulation layers is three or less, the resin insulation layer or the lower resin insulation layer is preferred to contain core material. By further repeating above steps (7)-(13), the substrate is multilayered, and a printed wiring board with three or more resin insulation layers may be manufactured. If the substrate has four or more layers, it is preferred that all the resin insulation layers be resin insulation layers without core material, and be made of resin and inorganic particles such as silica.

(15) Next, solder resist layer 70 with openings (70a) is formed on both surfaces of the intermediate substrate (FIG. 5B). Portions of the outermost conductive circuits and outermost via conductors exposed through openings (70a) will become external connection terminals.

(16) Next, protective film (not shown in the drawings) made of nickel film and gold film on the nickel film is formed on external connection terminals. Protective layer 74 is laminated on solder resist layer 70 and on the protective film. The edges of the substrate where protective layer 74 is formed on intermediate substrate 1000 are cut at lines (X-X) in the drawing (FIG. 5C). Then, intermediate bodies 10 on the upper-surface side and on the lower-surface side are separated from the support plate using removable layers 24 (FIG. 6A).

(17) Plated film (electrolytic copper-plated film) 36 and metal film (copper foil) 26 are removed by etching to expose upper portions of pads 76 from resin insulation layer 50 (FIG.

6B). Pad 76 is made up of a protruding portion and an embedded portion; the portion protruding from the first surface of resin insulation layer 50 is protruding portion (76B) and the portion embedded in resin insulation layer 50 is embedded portion (76A). The upper surface of the embedded portion left exposed by the protruding portion is preferred to be recessed from the surface (first surface) of the resin insulation layer. Short-circuiting may seldom occur between the bumps on adjacent pads. When conducting etching, coating layer (tin-plated film) 38 on the surface of pad 76 made of copper will function as a stopper. The coating layer is preferred to be formed on the upper and side surfaces of the protruding portion. Furthermore, the coating layer is preferred to be formed on the upper surface of the embedded portion left exposed by the protruding portion of the pad. If the side wall of the coating layer, which is formed on the upper surface of the embedded portion, makes contact with the resin insulation layer, the embedded portion of the pad will be seldom etched. When the plated film and the metal film are made of the same metal, and the coating layer is made of a metal other than that of the plated film, by selecting an etching solution, the plated film and the metal film may be selectively etched away while the coating layer will not be actually etched. When the coating layer is made of tin or solder, and the plated film and metal film are made of copper, an etching solution, brand name A-Process made by Meltex Inc., may be used. When the coating layer is made of copper, and the plated film and metal film are made of nickel, an etching solution, brand name NH-1860 series made by Mec Co. Ltd., may be used. When the coating layer is made of gold, and the plated film and metal film are made of copper, iron chloride or copper chloride may be used for an etching solution. When the coating layer is made of nickel, and the plated film and metal film are made of copper, an etching solution, brand name Mecbrite VE-7100 made by Mec Co., Ltd., may be used.

(18) Then, protective layer 74 is removed. Multilayer printed wiring board (10a) is completed. When protective film is not formed on the external connection terminals, an OSP for corrosion prevention is preferred to be applied to external connection terminals (258P) (FIG. 6C).

(18) In the following, tin-lead solder paste is printed on the top portions of pads 76 on the upper surface. Then, by conducting a reflow at 200°, solder bumps (solder bodies) are formed on the pads. A multilayer printed wiring board having solder bumps 78 is manufactured (FIG. 7).

IC chip 90 is mounted by means of solder bumps 78 on the upper surface. Then, the wiring board is mounted on motherboard 94 by means of solder bumps 79 on the lower surface (FIG. 8).

Second Embodiment

Figure 10:
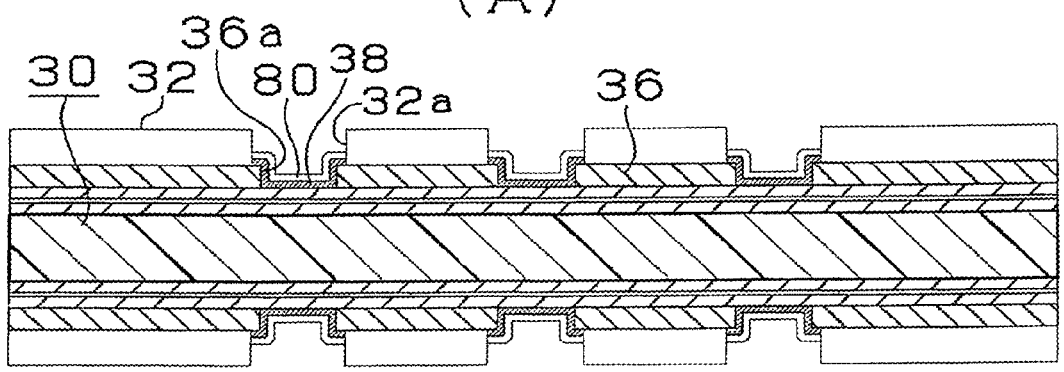
FIG. 10 includes views showing the steps of a method for manufacturing a multilayer printed wiring board according to the second embodiment of the present invention.
Figure 10:
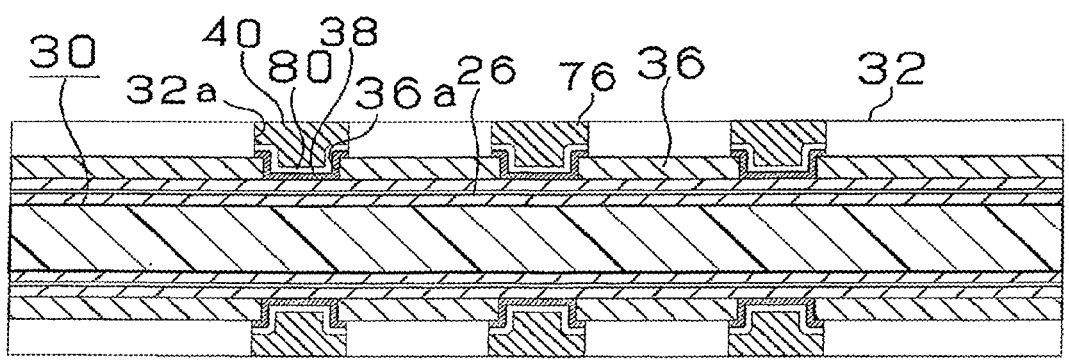
Figure 10:
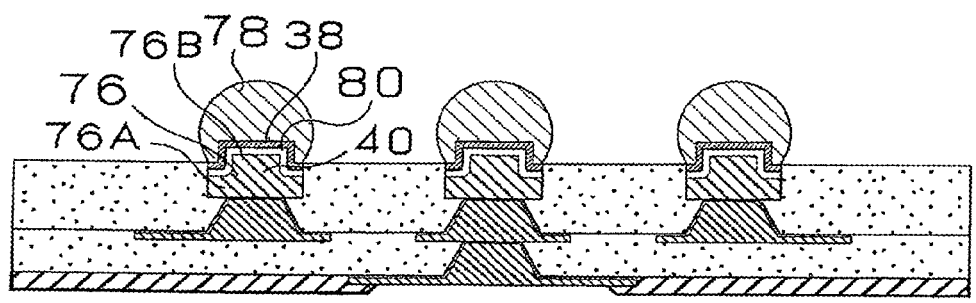

A method for manufacturing a multilayer printed wiring board according to the second embodiment of the present invention is described with reference to FIG. 10. FIG. 10C is a cross-sectional view of multilayer printed wiring board 10 of the second embodiment. In the first embodiment described above with reference to FIG. 7, tin-plated film 38 is coated on protruding portion (76B) of upper-surface pad 76, and solder bump 78 is formed on tin-plated film 38. By contrast, in the second embodiment, a coating layer, which is made of nickel-plated film (metal layer) 80 and tin-plated film (metal layer) 38 on the nickel film, is formed on pad 76 made of copper plating. By arranging a metal layer of nickel between a pad of copper plating and a metal layer of tin, a tin-copper alloy layer will seldom be formed. In the same manner, by arranging a coating layer containing a metal layer of nickel between a pad of copper plating and a bump containing tin, a tin-copper alloy layer will seldom be formed. As a result, the bonding strength between the pad and the bump increases.

In a multilayer printed wiring board of the second embodiment, a coating layer made of nickel-plated layer 80 and tin-plated film 38 is formed on the surface of protruding portion (76B) of pad 76. Since the corrosion resistance of nickel is high, connection reliability between a solder bump and the pad is ensured for a longer duration.

A method for manufacturing a multilayer printed wiring board of the second example is described. By performing electroless tin plating or electrolytic tin plating as described in above steps (1)-(3), tin-plated film 38 is formed on metal film 26 left exposed by second plating resist 32 (FIG. 1G). After that, electrolytic nickel plating or electroless nickel plating is performed to form nickel-plated film 80 on tin-plated film 38 (FIG. 10A). It is preferred that both tin plating and nickel plating be performed as electrolytic plating. The tin-plated film is preferred to be formed on the side wall of plated film 36 and on the top surface of plated film 36 which are left exposed by the second plating resist. Tin-plated film 38 is preferred to be coated by nickel-plated film 80.

Then, as in the first embodiment described above by referring to FIG. 2A, pads are formed by electrolytic plating in the spaces created by the coating layer and the second plating resist (FIG. 10B). The bottom surfaces of the pads are preferred to be flat. Since the rest of the steps are the same as in the first embodiment described with reference to FIG. 2B and subsequent drawings, their descriptions are omitted here.

Third Embodiment

Figure 11:
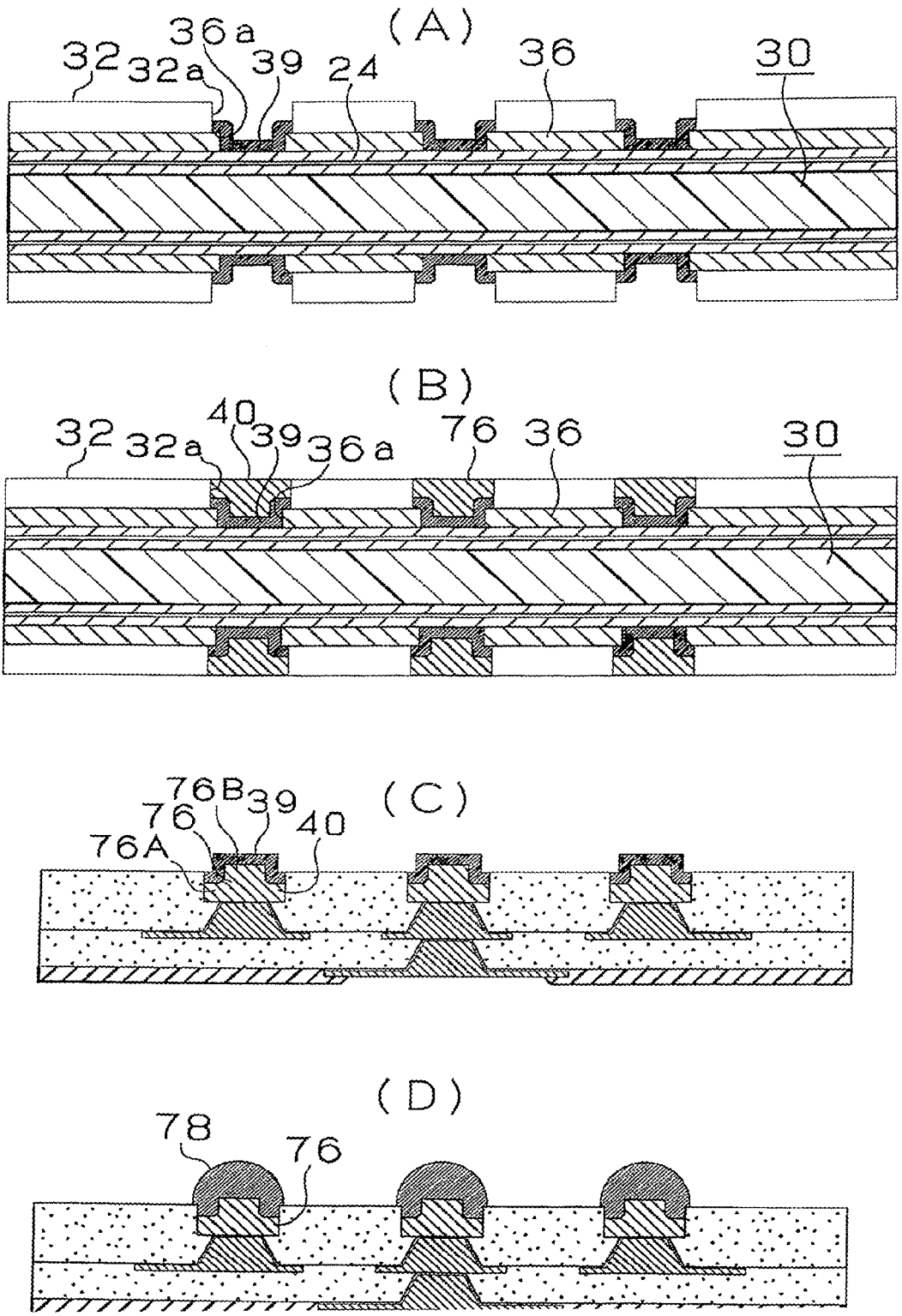
FIG. 11 includes views showing the steps of a method for manufacturing a multilayer printed wiring board according to the third embodiment of the present invention.

A multilayer printed wiring board according to the third embodiment of the present invention is described with reference to FIG. 11. In the first embodiment, solder paste was printed on the pads and reflowed to form solder bumps. By contrast, in the third embodiment, as shown in FIG. 11C, solder-plated film 39 is formed on pads 76 by plating. Then, by reflowing such solder film, solder bumps 78 are formed as shown in FIG. 11D.

A method for manufacturing a multilayer printed wiring board according to the Third Embodiment is described. As described in step (2) of the first embodiment by referring to FIG. 1F, second plating resist 32 is formed on plated film 36. It is preferred that the periphery of plated film 36 be left exposed by the second plating resist. Then, by performing electroless solder plating or electrolytic solder plating, solder-plated film 39 is formed on metal film 26 (FIG. 11A). It is preferred that the thickness of the solder-plated film be in the range of 10-50 µm, and that the solder-plated film be formed on the metal film, the side walls of plated film 36 and the top surface of plated film 36, which are left exposed by the second plating resist. If the thickness of the solder-plated film is in the range of 10-50 µm, the height of the solder bumps will become a proper height for mounting electronic components such as an IC.

Then, as in the First Embodiment described above by referring to FIG. 2A, pads 76 are formed by electrolytic plating in the spaces created by the solder-plated film 39 and the second plating resist (FIG. 11B). Pads may be formed on solder-plated film by means of a coating layer instead of being directly formed on the solder-plated film. For example, a nickel-plated film may be formed on the solder-plated film. The solder-plated film is formed by means of a coating layer residing on the top surface of a pad left exposed by a resin insulation layer. A coating layer may be formed with a metal layer, but may also be formed with multiple metal layers. When a coating layer is formed with a tin film, the wettability of the pads and solder is improved. Also, a coating layer made of tin film and nickel film may be arranged between solder-plated film and pads. When a coating layer is made of nickel film on the pad and a gold film on the nickel film, the bonding strength between pads and solder bumps increases. Because the rest of the steps are the same as in the first embodiment described with reference to FIG. 2B and subsequent drawings, their detailed descriptions are omitted here. By reflow, solder-plated film becomes solder bumps. In the third embodiment, solder bumps are formed directly on pads. However, if there is a coating layer made of nickel or the like, solder bumps will be formed on pads by means of the coating layer.

EXAMPLE

In the following, the present invention is further described in detail by referring to an example. However, the present invention is not limited to the scope of such an example. A method for manufacturing multilayer printed wiring board 10 of the example is described with reference to FIGS. 1-6.

(1) As the starting material, metal film 300 with a carrier is prepared as follows: On copper-clad laminate (carrier) (20A) formed by laminating 35 μm-thick copper foil 22 on both surfaces of insulative substrate 20 made of 0.8 mm-thick glass epoxy resin, metal film 26 made of copper foil is laminated by means of removable layer 24 made of nickel, chrome or the like (FIG. 1A). As shown in FIG. 1B, by applying adhesive 301 on the edges of metal film 300 with a carrier, the metal film and the carrier are secured. On copper foil 26 of metal film 300 with a carrier, a commercially available photosensitive dry film is laminated and a mask is placed on the dry film, which is then exposed at 110 mJ/cm$^2$ and developed with a 0.8% sodium carbonate solution. Accordingly, plating resist (first plating resist) 34 with a thickness of 25 μm is formed (FIG. 1C). Then, electrolytic plating is performed to form plated film 36 made of electrolytic copper-plated film with a thickness of 20 μM in areas where plating resist 34 is not formed (FIG. 1D). Plating resist (34) is removed using a 5% KOH solution (FIG. 1E).

(2) A commercially available photosensitive dry film is laminated on plated film 36 and a mask is placed on the dry film, which is then exposed at 110 mJ/cm$^2$, and developed with a 0.8% sodium carbonate solution. Accordingly, second plating resist 32 with a thickness of 25 μm is formed on plated film 36 (FIG. 1F). As shown in FIGS. 1F and 12, the peripheral portions of plated film 36 are left exposed by second plating resist 32. FIG. 12 is a plan view seen from the side of the second plating resist showing the substrate after the second plating resist is formed.

(3) Using metal film (copper foil) 26 and plated film (electrolytic copper-plated film) 36 as the seed, electrolytic tin plating is performed. Accordingly, coating layer 38 made of electrolytic tin-plated film with a thickness in the range of 0.1-1.0 μm is formed on the copper foil, and on the side walls of the electrolytic copper-plated film and on the electrolytic plated film, which are left exposed by the second plating resist (FIG. 1G).

(4) By performing electrolytic copper plating, pads 76 made of electrolytic copper-plated film are formed on coating film 38 (FIG. 2A). As shown in FIG. 2A, the space formed by the coating film (see FIG. 13A) and part of the space formed by the second plating resist (see FIG. 13B) are filled with electrolytic copper-plated film 36, and the bottom surface of electrolytic plated film 36 is made flat.

(5) Second plating resist 32 is removed by a 5% KOH solution to expose pads 76 (FIG. 2B). The surfaces of the pads are roughened (not shown in the drawings).

(6) Resin film for resin insulation layer (brand name ABF-45SH, made by Ajinomoto) is prepared.

(7) Resin film for resin insulation layer is laminated on pads 76 and on the metal film using vacuum laminator equipment. The conditions are vacuum degree of 67 Pa, pressure of 0.47 MPa, temperature of 85° C. and pressing time of 60 seconds. After that, by thermosetting at 170° C. for 40 minutes, resin insulation layer 50 is formed having a first surface and a second surface opposite the first surface (FIG. 3A). The side walls of the coating layer and the side walls of the embedded portions of the pads make contact with resin insulation layer 50. The bottom surfaces of the embedded portions of pads are also in contact with resin insulation layer 50. A pad has a first surface and a second surface (bottom surface) opposite the first surface, and the first surface of the pad is the surface that makes contact with the coating layer.

(8) Next, using a $CO_2$ gas laser, via openings (50a) are formed reaching from the second-surface side of resin insulation layer 50 to the bottoms of the pads (FIG. 3B).

(9) The substrate with via openings (50a) is immersed in an 80° C. solution containing permanganic acid at 60 g/l for 10 minutes to remove the particles residing on the surface of resin insulation layer 50. Accordingly, the surface of resin insulation layer 50 including the inner walls of via openings (50a) is roughened (not shown in the drawings).

(10) Next, the substrate with applied catalyst is immersed in an electroless copper plating solution (Thru-Cup PEA) made by C. Uyemura & Co., Ltd. Accordingly, electroless copper-plated film 52 with a thickness in the range of 0.3-3.0 μm is formed on the surface of resin insulation layer 50 including the inner walls of via openings (50a) (FIG. 3C).
[Electroless Plating Conditions]
solution temperature of 34° C. for 45 minutes

(11) A commercially available photosensitive dry film is laminated on the substrate where electroless copper-plated film 52 is formed, and a mask is placed on the dry film, which is then exposed at 110 mJ/cm$^2$ and developed with a 0.8% sodium carbonate solution. Accordingly, plating resist 54 with a thickness of 25 μm is formed (FIG. 4A).

(12) Then, the substrate is cleansed with 50° C. water for degreasing, washed with 25° C. water, and further cleansed with sulfuric acid. Then, electrolytic plating is performed under the following conditions to form electrolytic copper-plated film 56 with a thickness of 15 μm in areas where plating resist 54 is not formed (FIG. 4B).
[Electrolytic Plating Solution]

| sulfuric acid | 2.24 mol/l |
|---|---|
| copper sulfate | 0.26 mol/l |
| additive | 19.5 ml/l |

(Cupracid GL, made by Atotech Japan)

[Electrolytic Plating Conditions]

| current density | 1 A/dm$^2$ |
|---|---|
| time | 70 minutes |
| temperature | 22 ± 2° C. |

(13) Plating resist 54 is removed using a 5% KOH solution. After that, the electroless plated film between portions of the electrolytic copper-plated film is etched away using a mixed solution of sulfuric acid and hydrogen peroxide to form independent conductive circuits 58 and via conductors 60 (FIG. 4C). Then, the surfaces of conductive circuits 58 and via conductors 60 are roughened (not shown in the drawings).

(14) By repeating above steps (7)-(13), resin insulation layer (lower resin insulation layer) 250 having via conductors 260 and conductive circuits 258 is built up (FIG. 5A). Accordingly, intermediate substrate 1000 is completed.

(15) Next, commercially available solder-resist composition 70 is applied 20 μm thick on via conductors 260, conductive circuits 258 and lower resin insulation layer 250. Then, after drying the composition at 70° C. for 20 minutes, and at 70° C. for 30 minutes, solder resist film is formed on via conductors 260, conductive circuits 258 and resin insulation layer 250. After that, by exposing and developing the solder resist film, openings (70a) are formed in the solder resist film to expose conductive circuits 258 and via conductors 260. Then, the solder resist film is cured after being heated at 80° C. for an hour, at 100° C. for an hour, at 120° C. for an hour and at 150° C. for three hours. Solder resist layer 70 having openings (70a) and with a thickness of 15-25 μm is formed (FIG. 5B). Such a solder resist layer is formed on both surfaces of intermediate substrate 1000. Conductive circuits 258 and via conductors 260 exposed through openings (70a) will become external connection terminals.

(16) Next, protection layer 74 is laminated on solder resist layer 70 and external connection terminals. Then, the edges of intermediate substrate 1000 are cut at lines "X-X" in the drawing (FIG. 5C). At that time, the cutting position is inside adhesive 301 formed on the metal film with a carrier. After that, intermediate bodies 10 on the upper and lower sides are separated from double-sided copper-clad laminate (20A) using removable layers 24 (FIG. 6A).

(17) Electrolytic copper-plated film 36 and copper foil 26 are removed by etching using brand name Melstrip Cu-3931 made by Meltex Inc., and the upper portion of pad 76 is exposed from the first surface of resin insulation layer 50 (FIG. 6B). The portion of pad 76 protruding from the first surface of resin insulation layer 50 will become protruding portion (76B), and the portion embedded in resin insulation layer 50 will become embedded portion (76A). The upper surface of the embedded portion is recessed from the surface of the resin insulation layer. The side surface of the embedded portion and the side surface of the coating layer formed on the embedded portion are in contact with resin insulation layer 50. During that time, tin-plated film 38 on the surface of pad 76 made of copper works as a stopper. Since the coating layer and the metal film are made of different metals, and the coating layer and the plated film are also made of different metals, the metal film and the plated film may be selectively etched away. Metal film 38 made of tin, which is the coating layer, does not actually dissolve in Melstrip Cu-3931 (etching solution), while plated film 36 and metal film 26, made of copper, selectively dissolve in Melstrip Cu-3931 (etching solution). Therefore, etching will stop at the coating layer, and pads covered by the coating layer will not actually dissolve in the etching solution.

(18) After that, protective layer 74 is removed and an OSP for corrosion prevention is applied on lower-surface side pads (258P) (FIG. 6C). Multilayer printed wiring board (10a) is completed.

(18) In the following, on upper-surface pads 76, tin-lead solder paste is printed and reflowed at 200° C. to form solder bumps (solder bodies). Multilayer printed wiring board 10 having solder bumps 78 is manufactured (FIG. 7). Here, instead of tin-lead solder, tin-antimony or tin-silver solder may also be used. At the same time solder paste is being printed on upper-surface pads 76, tin-antimony solder paste may be printed in openings (70a) of lower-surface solder resist layer 70 and reflowed at 230° C. to form solder bumps (solder bodies) so that a multilayer printed wiring board having bumps both on the upper and lower surfaces may be manufactured.

IC chip 90 is mounted by means of upper-surface solder bumps 78, and the wiring board is loaded on daughterboard 94 by means of lower-surface solder bumps 79 (FIG. 8).

In the above embodiments, an example is described in which the pad structure of the present invention is applied in a built-up multilayer wiring board without a core substrate. However, the pad structure of the present invention may be used in various printed wiring boards.

A printed wiring board according to one aspect of the present invention includes the following: a resin insulation layer having a first surface, a second surface opposite the first surface, and an opening for a first via conductor; a pad for mounting an electronic component formed on the first-surface side of the resin insulation layer; a first conductive circuit formed on the second-surface side of the resin insulation layer; and a first via conductor formed in the opening for a first via conductor and connecting the pad and the first conductive circuit. In such a printed wiring board, the pad is made up of a portion embedded in the resin insulation layer and a portion protruding from the resin insulation layer, and the external shape of the embedded portion is greater than the external shape of the protruding portion.

In an embodiment of the present invention, a pad is made up of a portion (embedded portion) which is embedded in a resin insulation layer and of a portion (protruding portion) which protrudes from the resin insulation layer. The external shape of the protruding portion is smaller than the external shape of the embedded portion. Thus, the surface area of a pad according to an embodiment of the present invention is greater than that of a pad whose upper surface is configured flat. In so being set, the connection area between a pad and a solder bump increases, raising the connection strength between the pad and the solder bump. Thus, the connection reliability between the solder bump and the pad may be enhanced. If a pad has a protruding portion, a solder bump is formed around the protruding portion as well. Thus, the diameter of the solder bump tends to become larger than that of the pad. Accordingly, the space between the adjacent pads needs to be widened to avoid short-circuiting between the adjacent solder bumps. However, since the protruding portion is smaller than the embedded portion in an embodiment of the present invention, the solder bump seldom becomes larger than the external shape of the pad. As a result, pitch between the adjacent pads may be set smaller. Since a pad has a protruding portion, the height of the solder bump may increase. Thus, the space between the pad and an electrode of an IC chip to be mounted on the pad will be widened. Accordingly, stress generated in an electronic component such as an IC chip and the printed wiring board may be eased at the solder bump. Also, underfill may be easily filled between the IC chip and the printed wiring board.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:

forming a plated film on a metal film such that the plated film has an opening portion;

forming a pad on the plated film such that the pad has a coating layer formed in the opening portion of the plated film, a protruding portion formed in the opening portion of the plated film, and an embedded portion formed on the protruding portion and exposed over the plated film;

forming a resin insulation layer on the plated film and the pad such that a first surface of the resin insulation layer faces and covers the plated film and the pad and the embedded portion of the pad is embedded in the resin insulation layer;

removing the metal film and the plated film from the first surface of the resin insulation layer such that the protruding portion of the pad protrudes from the first surface of the resin insulation layer;

forming in the resin insulation layer an opening for a first via conductor such that the opening reaches the pad from a second surface of the resin insulation layer on an opposite side with respect to the first surface of the resin insulation layer;

forming a first conductive circuit on the second surface of the resin insulation layer; and forming the via conductor in the opening of the resin insulation layer such that the via conductor connects the first conductive circuit and the pad.

2. The method for manufacturing a printed wiring board according to claim 1, wherein the coating layer has a thickness which is greater than a thickness of the plated film.

3. The method for manufacturing a printed wiring board according to claim 1, further comprising:

forming a lower resin insulation layer on the second surface of the resin insulation layer;

forming in the lower resin insulation layer an opening for a second via conductor reaching the first conductive circuit or the first via conductor;

forming a second conductive circuit on the lower resin insulation layer; and forming a second via conductor in the opening for the second via conductor connecting the first conductive circuit and the second conductive circuit or connecting the first via conductor and the second conductive circuit.

4. The method for manufacturing a printed wiring board according to claim 1, wherein the metal film is formed on a support plate through a removable layer.

5. The method for manufacturing a printed wiring board according to claim 1, wherein the coating layer comprises tin plating.

6. The method for manufacturing a printed wiring board according to claim 1, wherein the coating layer comprises a nickel-plated film on the pad and a tin-plated film on the nickel-plated film.

7. The method for manufacturing a printed wiring board according to claim 1, further comprising forming a solder bump over the pad.

8. The method for manufacturing a printed wiring board according to claim 1, wherein the forming of the coating and the pad comprises forming a first plating resist on the metal film, forming the plated film on a portion of the metal film left exposed by the first plating resist, removing the first plating resist, forming a second plating resist on the plated film such that a periphery portion of the plated film is exposed, forming the coating layer by plating on a portion of the metal film left exposed by the second plating resist, forming the pad by plating on the coating layer, and removing the second plating resist.

9. The method for manufacturing a printed wiring board according to claim 2, further comprising:

forming a lower resin insulation layer on the second surface of the resin insulation layer;

forming in the lower resin insulation layer an opening for a second via conductor reaching the first conductive circuit or the first via conductor;

forming a second conductive circuit on the lower resin insulation layer; and forming a second via conductor in the opening for the second via conductor connecting the first conductive circuit and the second conductive circuit or connecting the first via conductor and the second conductive circuit.

10. The method for manufacturing a printed wiring board according to claim 2, wherein the metal film is formed on a support plate through a removable layer.

11. The method for manufacturing a printed wiring board according to claim 2, wherein the coating layer comprises tin plating.

12. The method for manufacturing a printed wiring board according to claim 2, wherein the coating layer comprises a nickel-plated film on the pad and a tin-plated film on the nickel-plated film.

13. The method for manufacturing a printed wiring board according to claim 2, further comprising forming a solder bump over the pad.

14. The method for manufacturing a printed wiring board according to claim 2, wherein the forming of the coating and the pad comprises forming a first plating resist on the metal film, forming the plated film on a portion of the metal film left exposed by the first plating resist, removing the first plating resist, forming a second plating resist on the plated film such that a periphery portion of the plated film is exposed, forming the coating layer by plating on a portion of the metal film left exposed by the second plating resist, forming the pad by plating on the coating layer, and removing the second plating resist.

15. The method for manufacturing a printed wiring board according to claim 3, wherein the metal film is formed on a support plate through a removable layer.

16. The method for manufacturing a printed wiring board according to claim 3, wherein the coating layer comprises tin plating.

17. The method for manufacturing a printed wiring board according to claim 3, wherein the coating layer comprises a nickel-plated film on the pad and a tin-plated film on the nickel-plated film.

18. The method for manufacturing a printed wiring board according to claim 3, further comprising forming a solder bump over the pad.

19. The method for manufacturing a printed wiring board according to claim 3, wherein the forming of the coating and the pad comprises forming a first plating resist on the metal film, forming the plated film on a portion of the metal film left exposed by the first plating resist, removing the first plating resist, forming a second plating resist on the plated film such that a periphery portion of the plated film is exposed, forming the coating layer by plating on a portion of the metal film left exposed by the second plating resist, forming the pad by plating on the coating layer, and removing the second plating resist.

20. The method for manufacturing a printed wiring board according to claim 1, wherein the metal film and the plated film are removed from the first surface of the resin insulation layer after the forming of the opening for the first via conductor, the forming of the first conductive circuit on the second surface of the resin insulation layer and the forming of the via conductor in the opening of the resin insulation layer.

* * * * *